(12) United States Patent
Yahiro

(10) Patent No.: US 6,635,402 B2
(45) Date of Patent: Oct. 21, 2003

(54) DEVICES FOR MEASURING AND ADJUSTING ILLUMINATION UNIFORMITY OBTAINED FROM A CHARGED-PARTICLE ILLUMINATION-OPTICAL SYSTEM

(75) Inventor: Takehisa Yahiro, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/323,085

(22) Filed: Dec. 18, 2002

(65) Prior Publication Data

US 2003/0096179 A1 May 22, 2003

Related U.S. Application Data

(62) Division of application No. 09/750,010, filed on Dec. 27, 2000, now Pat. No. 6,521,392.

(30) Foreign Application Priority Data

Dec. 28, 1999 (JP) .......................................... 11-373160

(51) Int. Cl.[7] .............................. G03C 5/00; G01K 1/08; G21K 5/10
(52) U.S. Cl. ...................... 430/296; 430/942; 250/397; 250/492.22; 250/492.23
(58) Field of Search ............................. 430/296, 942, 430/30; 250/397, 492.22, 492.23

(56) References Cited

U.S. PATENT DOCUMENTS 5,260,151 A 11/1993 Berger et al. .................. 430/5

5,689,117 A 11/1997 Nakasuji ................ 250/492.23

FOREIGN PATENT DOCUMENTS

JP 8-186070 7/1996

OTHER PUBLICATIONS

Golladay et al., "High emittance source for the PREVAIL projection lithography system," *J. Vac. Sci. Technol. B* 17(6):2856–2859, Nov./Dec. 1999.

*Primary Examiner*—Christopher G. Young
(74) *Attorney, Agent, or Firm*—Klarquist Sparkman LLP

(57) ABSTRACT

Methods and devices are provided for performing adjustments of illumination uniformity obtained from a charged-particle illumination-optical system as used, e.g., in a charged-particle-beam (CPB) microlithography apparatus. The adjustments are based on measurements of illumination-beam current density. The device includes an aperture plate (desirably a silicon membrane), defining a tiny measurement aperture (desirably about 1 μm diameter), mounted on the reticle stage at the reticle plane. The illumination beam is scanned over the aperture. Charged particles of the beam passing through the aperture are directed to a beam-current detector on or at the substrate stage. The membrane desirably has a thickness of about 1 to 3 μm. The measurement aperture allows the distribution of current density of the illumination beam to be measured highly accurately. The thinness of the membrane allows the membrane to scatter incident CPB radiation rather than absorbing the radiation, thereby preventing thermal deformation of the membrane.

10 Claims, 3 Drawing Sheets

DEVICES FOR MEASURING AND ADJUSTING ILLUMINATION UNIFORMITY OBTAINED FROM A CHARGED-PARTICLE ILLUMINATION-OPTICAL SYSTEM

CROSS-REFERENCE TO RELATED APPLICATION

This application is a divisional, and claims the benefit of, U.S. patent application Ser. No. 09/750,010, now U.S. Pat. No. 6,521,392, filed on Dec. 27, 2000.

FIELD OF THE INVENTION

The present invention pertains to microlithography (projection-transfer of a pattern, defined on a reticle or mask, onto a sensitive substrate using a charged particle beam (e.g., electron beam or ion beam) as an energy beam). Microlithography is a key technique used in the fabrication of microelectronic devices such as semiconductor integrated circuits, displays, or the like. More specifically, the invention pertains to methods for measuring and adjusting an illumination-optical system in a charged-particle-beam microlithography apparatus.

BACKGROUND OF THE INVENTION

Conventional microlithography apparatus and methods are summarized below in the context of using an electron beam as a representative charged particle beam. Electron-beam microlithography has the potential of producing higher resolution than optical microlithography (using light such as ultraviolet light). Unfortunately, the throughput currently obtained using conventional microlithography apparatus is disappointingly low.

Various techniques have been evaluated to improve throughput. Exemplary current techniques include cell projection, in which certain regions of a pattern, especially regions in which a basic pattern unit is repeated a large number of times (e.g., memory cells), are transferred multiple times from the basic pattern unit as defined on the reticle. Cell projection is known also as a "pattern-area batch-exposure system." When applied to mass production of semiconductor "chips," however, throughput typically is an order of magnitude lower than realized using optical microlithography. As the feature sizes of integrated circuits continue to decrease with increasing miniaturization, throughput becomes increasingly critical for determining the economic viability of fabrication processes.

An approach developed to achieve substantially improved throughput of electron-beam microlithography is the so-called full-chip batch-transfer approach, in which the entire pattern as defined on the reticle is exposed in a single exposure or "shot." The pattern is projected, with demagnification, onto the substrate using a projection lens. In other words, in this approach, all regions of the chip pattern on the reticle are illuminated at a single instant with an electron-beam "illumination beam." Unfortunately, the larger the chip pattern, the greater the difficulty of adequately controlling aberrations over the entire optical field of the illumination-optical system and projection-optical system.

To solve the aberration problems experienced using the full-chip batch-transfer approach, a "divided-reticle" approach has been proposed, in which the pattern as defined on the reticle is divided into multiple exposure units usually called "subfields." The subfields, typically sized much larger than the pattern units used in cell projection, are exposed individually in a sequential manner onto a suitable substrate (e.g., semiconductor wafer). The respective images of the subfields as projected onto the substrate are placed so as to be "stitched" together in a manner that yields a contiguous and properly aligned image of the entire pattern on the wafer. In this regard, reference is made to U.S. Pat. No. 5,260,151, incorporated herein by reference and Japan Kókai Patent Document No. Hei 8-186070.

An electron beam as used for cell projection has a very small beam diameter (about 5 $\mu$m at the reticle) for transferring the basic pattern units. Achieving homogeneous illumination of a region of such small dimensions on the reticle (i.e., achieving constant beam-current density across the illuminated region) is relatively easy to achieve. The electron beam is produced using an electron source having a conical electron-emitting surface. From the electron source, the illumination beam passes through a beam-shaping aperture that, especially because the beam is very narrow, does not degrade the transverse uniformity of the beam significantly. As a result, illumination homogeneity can be obtained.

However, with divided-reticle electron-beam microlithography apparatus, the area illuminated at any one instant by the illumination beam is much larger than in cell projection (e.g., subfield sizes of 1-mm square are used commonly). To illuminate such an area, a much larger-diameter illumination beam is used than used for cell-projection. Unfortunately, in conventional divided-reticle microlithography performed using a source having a conical electron-emitting surface, satisfactory uniformity of illumination is not achievable.

One approach to obtaining more uniform illumination in electron-beam microlithography apparatus (especially apparatus for performing batch transfer of large pattern areas) is using a source having a planar electron-emitting surface, and forming a "focused" image of the electron-emitting surface on the reticle. According to this approach, the quality of illumination reflects the quality and status of the beam source and of the lenses in the illumination-optical system. Unfortunately, using this approach, achieving actual illumination uniformity is exquisitely sensitive to variables such as (but not limited to) any of various operational parameters of the electron source and illumination-optical system, and variations in the planarity or condition of the electron-emission surface. Also, the various adjustments necessary to achieve and maintain uniform illumination uniformity are many and complex.

Highly accurate measurements of the transverse distribution of beam-current density (as a way to measure illumination uniformity) are required to make the adjustments to the electron-optical system and electron source necessary to achieve and maintain illumination uniformity. The measurement method conventionally used involves placing a measurement aperture (diameter of about 10 $\mu$m, made by forming an aperture in a metal sheet, such as molybdenum or tantalum, that is about 1 mm thick) on the reticle stage or on the substrate stage ("wafer stage"). The illumination beam is scanned over the measurement aperture while measuring the current density of charged particles passing through the measurement aperture, thereby providing a measurement of the illumination distribution achieved by the illumination beam.

Forming a measurement aperture by etching a hole in a metal sheet is extremely difficult. Also, an aperture having a diameter of 10 $\mu$m is essentially the smallest that can be made by etching a metal sheet. A 10-$\mu$m diameter aperture simply is too large to achieve a sufficiently high measurement resolution necessary for current needs. Another problem with this conventional method is that the relatively thick metal sheet tends to absorb particles of the illumination beam and consequently is heated excessively during use for making measurements. The heating causes deformations of the sheet (and can cause actual melting of the sheet) during use. Because of these problems, the required fine adjustments of the beam source or of the lenses of the illumination-optical system to obtain a satisfactorily uniform illumination distribution cannot be performed using conventional methods or measurement devices.

SUMMARY OF THE INVENTION

In view of the shortcomings of conventional measurement devices and methods as summarized above, an object of the invention is to provide improved devices and methods for measuring and adjusting the distribution of current density of a charged-particle-beam (CPB) illumination beam passing through an illumination-optical system. Another object is to provide improved methods and devices for achieving uniformity (homogeneity) of the illumination beam as incident on the reticle.

To such ends and according to a first aspect of the invention, methods are provided for measuring the illumination uniformity of the illumination beam. The methods are provided in the context of performing CPB microlithography in which an illumination beam, generated by a planar CPB-emission surface and passing through an illumination-optical system, illuminates a region of a patterned reticle to produce an imaging beam directed by a projection-optical system to a substrate. In an embodiment of the subject method, an aperture plate is provided that defines a measurement aperture. The aperture plate is placed on the reticle stage at a reticle plane. The illumination beam is directed to be incident on the measurement aperture as the illumination beam is deflected across the measurement aperture in a scanning manner. Charged particles of the illumination beam passing through the measurement aperture are directed to a beam-current detector. Using the beam-current detector, the current-density profile of the charged particles incident on the detector is determined to obtain a measurement of the distribution of beam-current density of the illumination beam as incident on the measurement aperture. The aperture plate can be a silicon membrane (desirably having a thickness of no greater than 3 $\mu$m), and the measurement aperture desirably is no greater than 2 $\mu$m in diameter.

According to another aspect of the invention, methods are provided for adjusting an illumination uniformity of the illumination beam as incident on the reticle. The methods are provided in the same context as noted above, and involve a similar series of steps as the method summarized above. In addition, the subject adjustment method includes a step in which, based on the beam-current measurements obtained in the preceding step, at least one of the CPB source and the illumination-optical system is adjusted to obtain a homogeneous distribution of beam-current density as incident on the reticle.

According to another aspect of the invention, devices are provided (in the context of a CPB microlithography apparatus as summarized above) for measuring an illumination uniformity of the illumination beam as incident on the reticle. An embodiment of such a device comprises an aperture plate situated at a reticle plane on the reticle stage. The aperture plate defines a measurement aperture extending in a direction parallel to an optical axis of the CPB microlithography apparatus. The aperture plate desirably is a silicon membrane no more than 3 $\mu$m thick, and the measurement aperture desirably is no greater than 2 $\mu$m in diameter. The device also includes a beam-current detector situated at the substrate stage. The beam-current detector is configured to measure a current-density profile of the imaging beam as incident on the beam-current detector, so as to obtain a measurement of the distribution of beam-current density of the illumination beam as incident on the measurement aperture. The aperture plate can include a strut to strengthen and support the aperture plate.

Hence, uniform illumination intensity in a CPB microlithography apparatus configured to perform batch-transfer of a pattern from a divided reticle is obtained by using a CPB source having a planar CPB-emission surface. The illumination beam generated by the source is trimmed to the desired transverse profile by passage through a beam-shaping aperture. An image of the planar emission surface is focused at the beam-shaping aperture and at the reticle. As noted above, illumination uniformity is desired. However, conventionally, obtaining satisfactory illumination uniformity is extremely difficult because the necessary fine adjustments of the CPB source and/or of the illumination-optical system cannot be performed. The instant invention solves this problem by providing much more accurate and precise measurements of the distribution of beam-current density of the illumination beam. Based on information obtained from the measurements, fine adjustments to the CPB source and illumination-optical system now can be made as required to obtain the desired uniform intensity distribution.

In accordance with the invention, it has been discovered that silicon provides a suitable substrate material in which to define the tiny measurement aperture used in the subject devices and methods. Also, by making the aperture plate extremely thin (e.g., 1–3 $\mu$m), the membrane scatters incident charged particles rather than absorbing them. Consequently, problems (e.g., aperture damage and/or dimensional changes) conventionally associated with heating of the material in which the aperture is formed are eliminated.

The foregoing and additional features and advantages of the invention will be more readily apparent from the following detailed description, which proceeds with reference to the accompanying drawings.

DETAILED DESCRIPTION

This invention is described below in the context of a representative embodiment, which is not intended to be limiting in any way. Furthermore, although the invention is described in the context of using an electron beam as a representative charged particle beam, it will be understood that the principles described herein can be applied readily to use of another type of charged particle beam, such as an ion beam.

Figure 3:
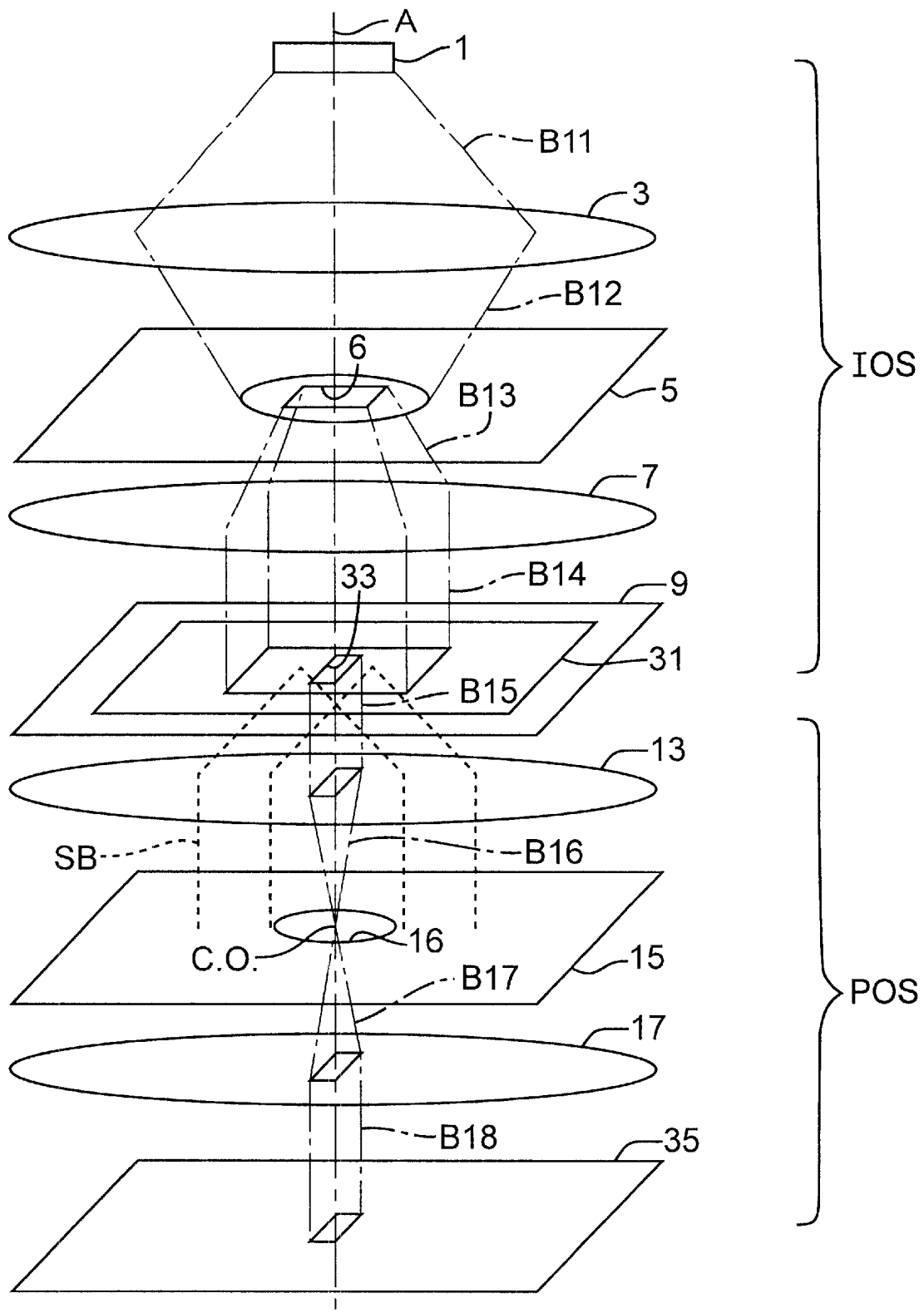
FIG. 3 is a schematic optical diagram showing certain imaging relationships in the CPB-optical system of a CPB microlithography apparatus configured to perform divided-reticle projection microlithography in a "batch-transfer" manner.

FIG. 3 depicts an electron-optical system (comprising an illumination-optical system IOS and a projection-optical system POS) of a charged-particle-beam (CPB) microlithography apparatus useful for making relatively large-area batch transfers of pattern portions defined on a divided reticle. FIG. 3 also depicts certain optical relationships relevant to understanding the invention.

An illumination beam B11 is produced by an electron source 1 desirably comprising a planar electron-emitting surface. The source 1 is situated at an extreme "upstream" end of the illumination-optical system IOS, and emits an illumination beam B11 in a "downstream" direction. A first illumination lens 3 is situated below the electron source 1. The first illumination lens 3 converges the illumination beam B11 onto a downstream beam-shaping aperture plate 5. (Although the beam B11 downstream of the first illumination lens 3 is denoted B12, the beam B12 nevertheless is the illumination beam.)

The beam-shaping aperture plate 5 defines a beam-shaping aperture 6. The beam-shaping aperture 6 has a prescribed size and profile through which a portion of the illumination beam B12 passes. Other portions of the beam B12 are blocked by the beam-shaping aperture plate 5. The portion of the illumination beam B12 passing through the beam-shaping aperture 6 is denoted B13 (which nevertheless is the illumination beam). A second illumination lens 7 is situated downstream of the beam-shaping aperture 6, and a reticle stage 9 is situated below the second illumination lens 7. A reticle 31 is mounted on the reticle stage 9. The reticle 31 defines a pattern, comprising a large number of pattern elements (only one pattern element 33 is shown as an aperture extending through the reticle), to be projected onto a wafer located downstream of the reticle 31.

The beam B13 is collimated by the second illumination lens 7 to form the collimated beam denoted B14 (which nevertheless is the illumination beam). The collimated beam B14 is incident on the reticle 31. As the illumination beam thus illuminates a selected region on the reticle 31, the portion of the illumination beam passing through the reticle 31 constitutes an "imaging beam" that propagates from the reticle to a downstream wafer or substrate (generally termed a "wafer").

A first projection lens 13 and a scattering-aperture plate 15 are situated downstream of the reticle 31. The scattering-aperture plate 15 defines a scattering aperture 16. An imaging beam B15 produced by passage of the illumination beam B14 through the pattern element 33 on the reticle 31 is demagnified by passage through the first projection lens 13, thereby producing the beam B16 (which nevertheless is the imaging beam). The imaging beam B16 passes through the scattering aperture 16, forming the beam denoted B17 (which nevertheless is the imaging beam). The imaging beam B17 is collimated by passage through a second projection lens 17 situated downstream of the scattering-aperture plate 15. A wafer (not shown) is mounted on a wafer stage 35 situated downstream of the second projection lens 17. The collimated imaging beam B18 produced by the second projection lens 17 is imaged on the surface of the wafer. So as to be imprintable with the image, the wafer is coated with a suitable "resist." Hence, the wafer is termed "sensitive" to exposure to the imaging beam B18. The wafer stage 35 is movable in the X-Y direction to allow images to be formed at desired locations on the wafer surface.

A crossover C.O. is formed at a point (on the optical axis A) at a location determined by the demagnification ratio of the projection-optical system POS. The scattering aperture 16 is centered on the optical axis A at the crossover C.O. The scattering aperture plate 15 blocks scattered charged particles in the imaging beam. As a result, scattered portions SB of the imaging beam (produced by passage of the illumination beam through non-patterned portions of the reticle 31) do not reach the wafer.

Figure 1:
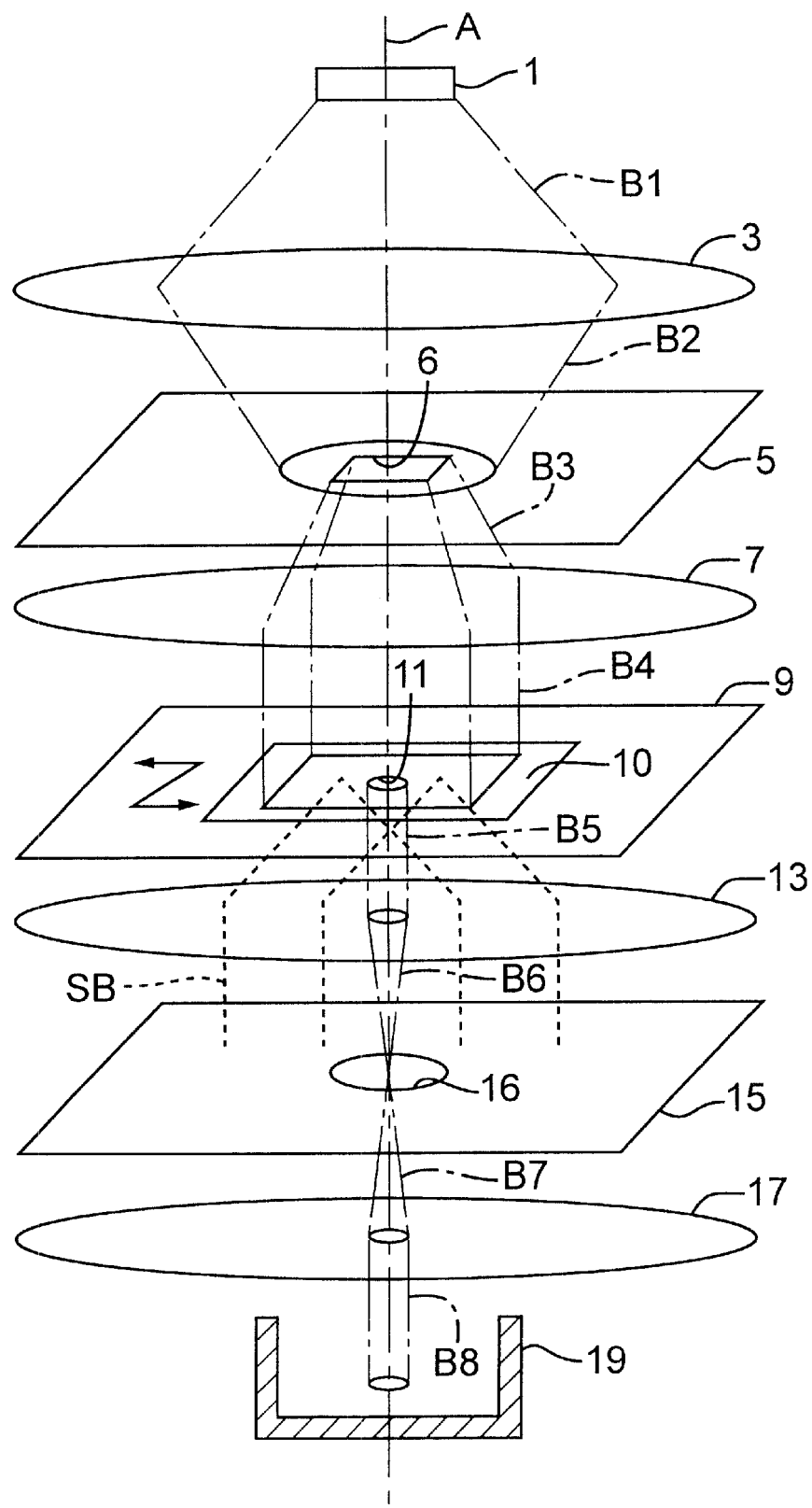
FIG. 1 is a schematic optical diagram of certain aspects of a representative embodiment of a device and method, according to a representative embodiment, for measuring the distribution of beam-current density of an image of the beam-emission surface of a charged-particle-beam (CPB) microlithography apparatus.

FIG. 1 schematically depicts a device and method for measuring the distribution of beam-current density of the optical source image in a CPB microlithography apparatus, according to a representative embodiment of the invention. In FIG. 1, components that are the same as respective components shown in FIG. 3 have the same respective reference numerals. In the FIG. 1 embodiment, a silicon (Si) membrane 10 is situated on (or at least at) the reticle stage 9 of the CPB microlithography apparatus. The Si membrane 10 defines a measurement aperture 11 used for measuring the distribution of beam-current density (as described later below). A beam-current detector 19 (e.g., a Faraday cup) is disposed on (or at least at) the wafer stage 35.

An illumination beam B1 produced by an electron source 1 desirably configured with a planar electron-emission surface extending perpendicularly to the axis A. The illumination beam B1 is converged by the first illumination lens 3 to form the illumination beam denoted B2. The illumination beam B2 converges on the beam-shaping aperture 6 defined by the beam-shaping aperture plate 5. The illumination beam B3 formed by passage of the beam B2 through the beam-shaping aperture 6 is collimated by the second illumination lens 7. The collimated illumination beam B4 is incident on the surface of the reticle stage 9. In this embodiment, the Si membrane 10, which defines the measurement aperture 11 as described above, is mounted on the reticle stage 9. The illumination beam B4 is scanned by a deflection coil (not shown but located upstream of the reticle stage 9) over the measurement aperture 11. As the illumination beam B4 is scanned in this manner, a narrow beam B5 is produced by charged particles of the illumination beam B4 passing through the measurement aperture 11. The beam B5 is demagnified by passage through the first projection lens 13 to form a demagnified beam B6. The beam B6 "crosses over" the optical axis A at the scattering aperture 16, defined by the scattering-aperture plate 15, and thus passes through the scattering aperture 16. Portions SB of the beam scattered by the Si membrane 10 are blocked by the scattering-aperture plate 15. A beam B7, formed by passage of the beam B6 through the scattering aperture 15, is collimated by passage through the second projection lens 17. The resulting collimated beam B8 propagates to a beam-current detector 19. In this embodiment, the beam-current detector 19 is located on the wafer stage 35. The distribution of beam-current density of the illumination beam at the reticle stage 9 is measured by measuring the beam current incident to the beam-current detector 19.

Figure 2A:
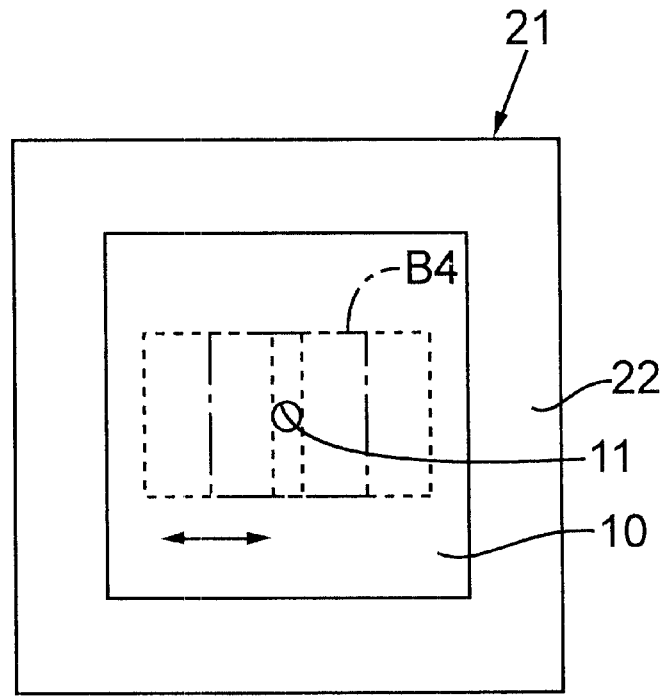
FIGS. 2(a) and 2(b) are a schematic plan view and elevational section, respectively, of a measurement aperture, according to the representative embodiment, intended for placement on the reticle stage.
Figure 2B:
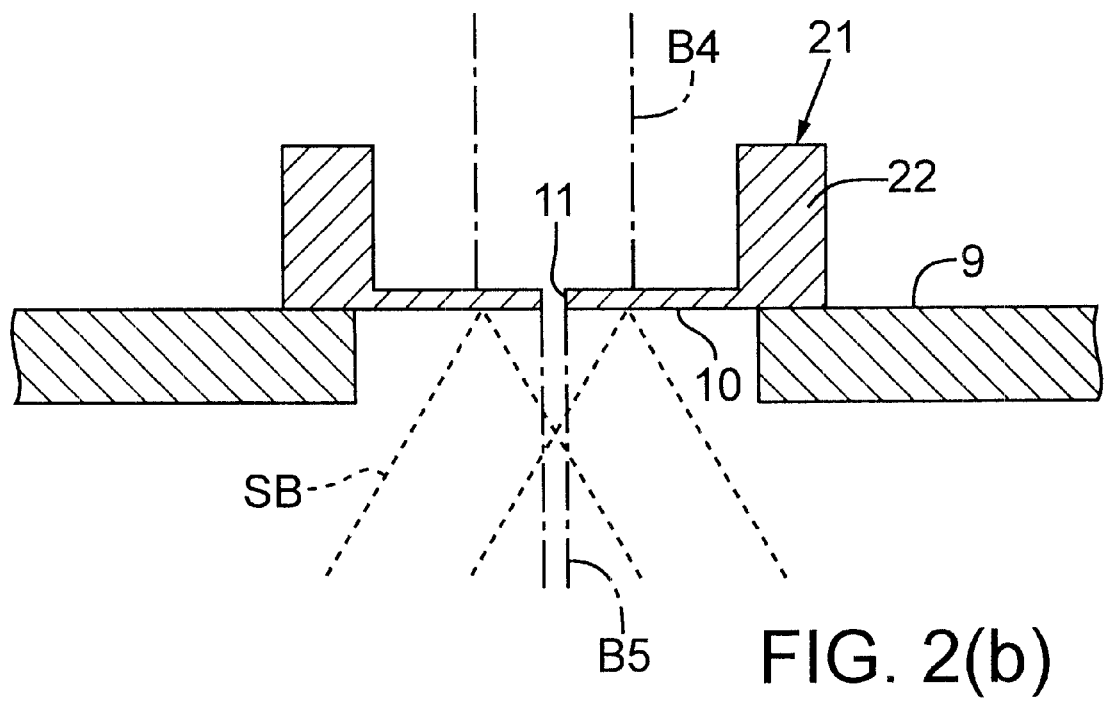

FIGS. 2(a)–(b) schematically depict details of a Si membrane 10 and surrounding structure. FIG. 2(a) is a plan view, and FIG. 2(B) is an elevational section of FIG. 2(a), showing the Si membrane 10 placed on the reticle stage 9.

In the depicted embodiment, the Si membrane 10 has a square profile, with dimensions of 3 mm×3 mm. The Si membrane 10 comprises a support strut 22 desirably protruding "upward" (in an upstream direction) at the periphery of the membrane 10. The support strut 22 strengthens and supports the membrane 10. The measurement aperture 11 is formed in the center of the Si membrane 10. The resulting membrane structure 21, comprising the Si membrane 10 bounded by the support strut 22, is mounted on the reticle stage 9.

The illumination beam B4, formed by the beam-shaping aperture 6 and collimated by the second illumination lens 7, is incident near the center of the Si membrane 10 on the reticle stage 9. The illumination beam B4 is scanned by a deflection coil (not shown) situated upstream of the reticle stage 9 (scanning indicated by double-headed arrow in FIG. 2(a)). The illumination beam B4 passes through the measurement aperture 11 and thus becomes the beam B5 (FIG. 2(b)). The beam B5 passes through the first projection lens 13, the scattering aperture 16, and the second projection lens 17 to be incident on the beam-current detector 19 at the wafer stage 35. As the beam B4 is scanned by the deflection coil, the beam current at each instantaneous "scan location" of the beam is detected. From the beam-current measurements, the distribution of beam-current density is determined.

The measurement aperture 11 has tiny dimensions, desirably no greater than about 1 $\mu$m diameter. Hence, measurement of the beam current and determination of the beam-current density distribution are executed with very high accuracy. The thickness of the Si membrane 10 desirably is about 2 $\mu$m (more generally about 1–3 $\mu$m). As a result, the beam irradiated on the Si membrane 10 is scattered only and is not absorbed, so almost no heating of the Si membrane 10 occurs.

Exemplary causes of degradation of in-plane homogeneity of illumination are primarily: (1) inadequate or improper axial adjustment of the lenses of the illumination-optical system IOS, which causes large image-field-curvature aberration and spherical aberration, resulting in the image of the planar emission surface of the source 1 not focusing correctly on the reticle surface, and (2) non-homogeneity in the planar emission surface of the source 1. To prevent these problems from arising and to obtain excellent in-plane homogeneity, the distribution of the beam-current density from the source 1 is measured as described above. Based on that information, adjustments are made to the optical axis, the source 1 (e.g., electron gun), and beam focus.

The measurement aperture 11 in the Si membrane can be made by the following representative fabrication method:

First, a silicon substrate is provided. To manufacture a membrane from the substrate, the substrate is back-etched. Etching methods can be classified broadly into two methods: wet etching and dry etching. Dry etching desirably is used. First, the silicon substrate is doped with boron to form a boron-doped layer at the substrate surface. The depth of the boron-doped layer represents the desired thickness of the Si membrane ultimately to be formed. Subsequently, both surfaces of the substrate are oxidized thermally to form a "front-surface" (obverse-surface) SiO$_2$ film of thickness 2 $\mu$m and a "rear-surface" (reverse-surface) SiO$_2$ film of thickness 2 $\mu$m on the substrate.

A resist layer is coated on the rear-surface SiO$_2$ film. The pattern of struts intended to support the membrane is exposed on the resist using an aligner. The exposed resist is developed, and the rear-surface SiO$_2$ film is dry-etched, using remaining resist as a mask. Next, the silicon substrate is dry-etched using the rear-surface SiO$_2$ film as a mask. During this dry-etching step, a few $\mu$m or so of the silicon substrate remain from the bottom of the boron-doped layer (residual film). This forms the support strut for the membrane 10. Using the rear-surface SiO$_2$ as a mask, wet-etching is performed to a required depth to form a boron-doped silicon membrane 10.

The front-surface SiO$_2$ film is removed from the membrane, and a layer of resist is coated on the membrane surface. A pattern defining the measurement aperture is exposed onto the resist. The resist is developed, and undeveloped resist is removed. Using the remaining resist as a mask, the Si membrane is dry-etched to form the measurement aperture in the Si membrane. The remaining resist film is removed to form the final membrane structure.

As is evident from the foregoing description, in a batch-transfer type of CPB microlithography apparatus, the present invention facilitates the obtaining of measurements of the distribution of beam-current density of the illumination beam with high accuracy. Such measurements allow highly accurate and precise adjustments of the CPB source and/or lenses of the illumination-optical system. Consequently, the adjustments produce increased in-plane homogeneity of illumination and increased control of beam width. These results generally improve the overall microelectronic-device fabrication process.

Whereas the invention has been described in connection with representative embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. In a charged-particle-beam (CPB) microlithography apparatus in which an illumination beam, generated by a CPB source including a CPB-emission surface, passes through an illumination-optical system and illuminates a region of a patterned reticle situated on a reticle stage to produce an imaging beam directed by a projection-optical system to a substrate situated on a substrate stage, a device for measuring an illumination uniformity of the illumination beam as incident on the reticle, the device comprising:

an aperture plate situated at a reticle plane on the reticle stage, the aperture plate defining a measurement aperture extending through the aperture plate in a direction parallel to an optical axis of the CPB microlithography apparatus; and a beam-current detector situated at the substrate stage, the beam-current detector being configured to measure a current-density profile of the imaging beam as incident on the beam-current detector to obtain a measurement of the distribution of beam-current density of the illumination beam as incident on the measurement aperture.

2. The device of claim 1, wherein the aperture plate is a silicon membrane.

3. The device of claim 1, wherein the measurement aperture is no greater than 2 $\mu$m in diameter.

4. The device of claim 1, wherein the aperture plate has a thickness of no greater than 3 $\mu$m.

5. The device of claim 1, further comprising a beam-shaping aperture situated axially in the illumination-optical system such that the illumination beam propagating to the measurement aperture passes through the beam-shaping aperture.

6. The device of claim 1, wherein the CPB-emission surface is planar.

7. The device of claim 1, wherein the aperture plate comprises a support strut.

8. A CPB microlithography apparatus, comprising the device of claim 1.

9. A reticle stage, comprising the device of claim 1.

10. A CPB microlithography apparatus, comprising the reticle stage of claim 9.

* * * * *

UNITED STATES PATENT AND TRADEMARK OFFICE
CERTIFICATE OF CORRECTION

PATENT NO. : 6,635,402 B2
DATED : October 21, 2003
INVENTOR(S) : Yahiro

It is certified that error appears in the above-identified patent and that said Letters Patent is hereby corrected as shown below:

Column 2,
Lines 7-8, "Japan K óka:" should be -- Japan *Kôkai* --.

Column 6,
Lines 25-26, "source 1 desirably" should be -- source 1 is desirably --.

Signed and Sealed this

Twenty-seventh Day of April, 2004

JON W. DUDAS
*Acting Director of the United States Patent and Trademark Office*